US006993301B1

(12) United States Patent
Kenington et al.

(10) Patent No.: US 6,993,301 B1
(45) Date of Patent: Jan. 31, 2006

(54) LINEARISER FOR A SIGNAL HANDLING APPARATUS

(75) Inventors: Peter Kenington, Chepstow (GB); Steven Richard Ring, Bristol (GB); Richard Michael Bennett, Salisbury (GB)

(73) Assignee: Andrew Corporation, Orland Park, IL (US)

( * ) Notice: Subject to any disclaimer, the term of this patent is extended or adjusted under 35 U.S.C. 154(b) by 389 days.

(21) Appl. No.: 10/088,424

(22) PCT Filed: Sep. 13, 2000

(86) PCT No.: PCT/GB00/03528

§ 371 (c)(1),
(2), (4) Date: Aug. 14, 2002

(87) PCT Pub. No.: WO01/20775

PCT Pub. Date: Mar. 22, 2001

(30) Foreign Application Priority Data

Sep. 13, 1999 (GB) .................................... 9921570

(51) Int. Cl.
 *H04B 1/02* (2006.01)
 *H03F 1/26* (2006.01)

(52) U.S. Cl. ..................... 455/114.3; 455/126; 330/149
(58) Field of Classification Search ............. 455/114.3, 455/115.1, 126, 114.2; 330/149; 375/297, 375/296

See application file for complete search history.

(56) References Cited

U.S. PATENT DOCUMENTS

| 4,331,928 | A | | 5/1982 | Heidt |
| 4,943,783 | A | * | 7/1990 | Nojima ........................ 330/149 |
| 5,049,832 | A | * | 9/1991 | Cavers ........................ 330/149 |
| 5,164,678 | A | | 11/1992 | Puri et al. |
| 5,193,224 | A | * | 3/1993 | McNicol et al. ............ 455/126 |
| 5,404,378 | A | * | 4/1995 | Kimura ....................... 375/296 |
| 5,929,703 | A | | 7/1999 | Sehier |
| 6,075,411 | A | * | 6/2000 | Briffa et al. ................. 330/149 |
| 6,275,685 | B1 | * | 8/2001 | Wessel et al. ............... 455/126 |

FOREIGN PATENT DOCUMENTS

EP   0 067 091 A1   12/1982

(Continued)

*Primary Examiner*—Edward F. Urban
*Assistant Examiner*—Blane J. Jackson
(74) *Attorney, Agent, or Firm*—Steve Mendelsohn (57) ABSTRACT

A lineariser (100) for reproducing distortion present in the output of an amplifier (110) (or other signal handling device) generates a predistortion signal from the amplifier input. The predistortion signal is mixed into the amplifier input signal using, for example, a vector modulator (112). The predistortion signal may be derived in a quadrature format, the orthogonal components of the predistortion signal being mixed into separate mixers of the vector modulator. The predistortion signal is generated by multiplying the input signal with itself repeatedly to generate components of distortion which are susceptible of independent control. The predistortion signal is generated digitally using DSP (116). A multiplier or mixer may be used to square the sampled input signal to produce a reduced frequency signal which the DSP can use to gennerate the predistortion signal. Another lineariser mixes the predistortion signal into the input signal during up conversion.

52 Claims, 11 Drawing Sheets

FOREIGN PATENT DOCUMENTS

| | | |
|---|---|---|
| EP | 0067091 A | 12/1982 |
| EP | 0 751 614 A1 | 1/1997 |
| EP | 0751614 A | 1/1997 |
| EP | 1 011 192 A2 | 6/2000 |
| FR | 2 540 309 A1 | 8/1984 |
| FR | 2540309 | 8/1984 |
| GB | 2 318 938 A | 5/1998 |
| WO | WO 99/45638 A1 | 9/1999 |
| WO | WO 99/45640 A1 | 9/1999 |
| WO | WO 9945638 A | 9/1999 |
| WO | WO 9945640 A | 9/1999 |

* cited by examiner

LINEARISER FOR A SIGNAL HANDLING
APPARATUS

FIELD OF THE INVENTION

This application relates to methods and apparatus for signal processing, in particular methods and apparatus for linearising, or reducing distortion appearing in, the output signal which a signal handling means produces in response to an input signal.

BACKGROUND OF THE INVENTION

Predistortion schemes for reducing distortion appearing in the output of a non-linear amplifier are known. A synthesised distortion signal is added into the input to the amplifier. The distortion signal is arranged so that its addition tends to cancel any distortion imposed on the input signal by the amplifier during amplification.

SUMMARY OF THE INVENTION

According to a first aspect, the present invention provides a lineariser for reducing distortion of the output signal which a signal handling means produces in response to an input signal, the lineariser comprising means for extracting a portion of the input signal, means for modifying the extracted signal to create non-linear components of reduced frequency therein, means for generating digitally a distortion signal from the modified signal and means for combining the distortion signal with the input signal.

The invention may thus provide a flexible distortion reduction system which is capable of implementing relatively complex forms of distortion correction. The generation of reduced frequency components in the extracted portion of the input signal facilitates the use of digital signal processing in the generation and adaptation of the distortion signal for combination with the input signal to achieve distortion reduction therein. Since the lineariser according to certain embodiments of the invention does not rely on local oscillator signals or any other form of reference from the host system of which it is a part, it can be implemented as a stand alone subsystem. This can be a significant benefit in many applications. It could even be located remotely from the rest of the system (e.g. a cellular radio base station).

According to a second aspect, the invention provides a lineariser for reducing distortion of the output signal which a signal handling means produces in response to an analogue RF input signal, the lineariser comprising means for extracting a portion of the input signal, means for generating digitally a distortion signal from the extracted signal and means for mixing the distortion signal into the input signal.

The invention also provides a method of reducing distortion of the output signal which a signal handling means produces in response to an input signal, the method comprising extracting a portion of the input signal modifying the extracted signal to create non-linear components of reduced frequency therein, generating digitally a distortion signal from the modified signal and combining the distortion signal with the input signal.

Furthermore, the invention also provides a method of reducing distortion of the output signal which a signal handling means produces in response to an analogue RF input signal, the method comprising extracting a portion of the input signal, generating digitally a distortion signal from the extracted signal and mixing the distortion signal into the input signal.

BRIEF DESCRIPTION OF THE DRAWINGS

By way of example only, certain embodiments of the invention will now be described with reference to the accompanying figures, in which.

DETAILED DESCRIPTION

Figure 1:
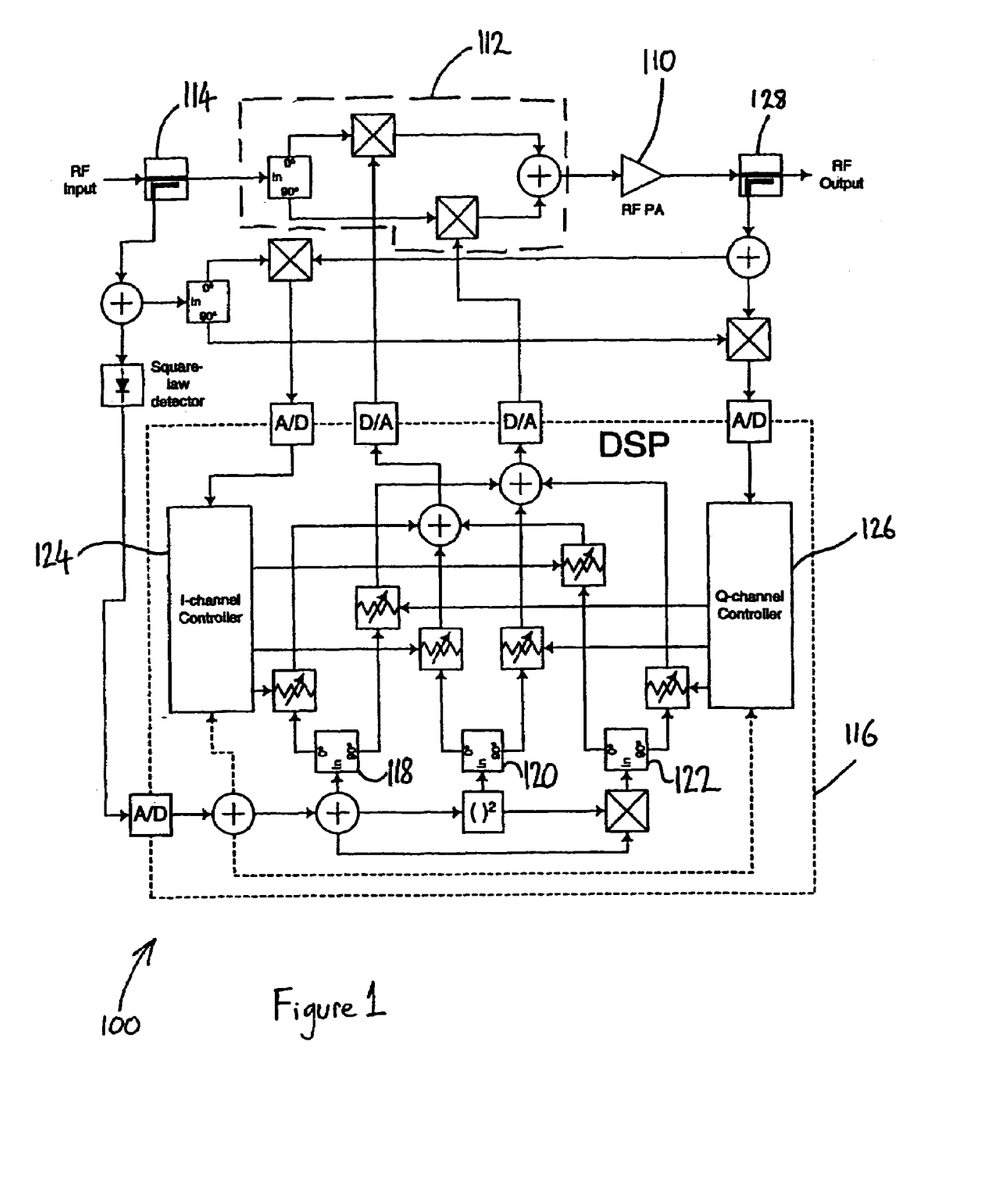
FIG. 1 is a schematic diagram of a lineariser circuit.

As shown in FIG. 1, a lineariser 100 is arranged to operate on the input to a radio frequency power amplifier (RF-PA) 110. The input signal to amplifier 110 is modified in a vector modulator 112 which precedes amplifier 110. The lineariser 100 produces in phase and quadrature predistortion components which are each mixed into a respective branch of the input signal within vector modulator 112. The input signal supplied to amplifier 110 is predistorted to counter distortion which the amplifier 110 causes to signals passing through it.

In general, the predistortion is derived from a portion of the input signal which is sampled using directional coupler 114 which precedes vector modulator 112. The operation of the square law detector will be discussed later. The sample taken from the input signal is manipulated using digital signal processor (DSP) 116. The DSP 116 provides three distortion components, each of which is split into orthogonal inphase and quadrature components by splitters 118,120, 122. Each of the three inphase distortion components is then subjected to amplitude control by I channel controller 124. The adjusted inphase components are then summed to provide an inphase predistortion component which can be mixed into the input signal by vector modulator 112. Similarly, the three quadrature distortion components produced by splitters 118 to 122 are adjusted in amplitude under the control of Q channel controller 126, prior to being summed to produce the quadrature predistortion component for mixing into the amplifier input signal in vector modulator 112. The controllers 124 and 126 monitor signals derived from feedback from the output of amplifier 110 (sampled at directional coupler 128) in order to determine the amplitude adjustments to be made to the various distortion components. The control process will be discussed in more detail later.

The lineariser 100 is a vector lineariser which mixes orthogonal predistortion components into respective orthogonal input signal components. A scalar lineariser having a more simple construction will now be described with reference to FIG. 2. It will be apparent to a reader skilled in the art that the lineariser of FIG. 2 can be extended to implement a vector linearisation scheme of a type shown in FIG. 1.

Figure 2:
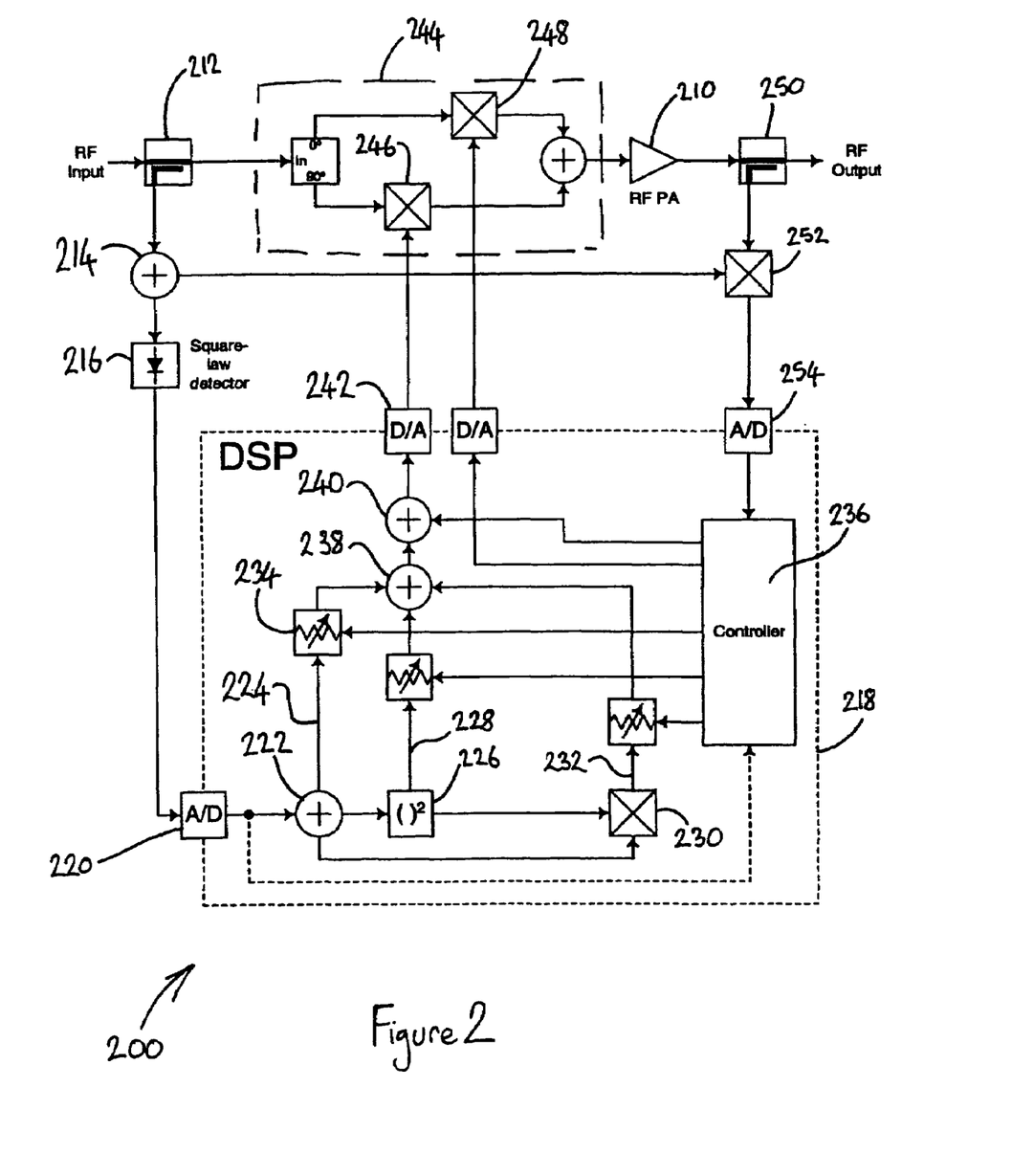
FIG. 2 is a schematic diagram of another lineariser circuit.

FIG. 2 illustrates a scalar lineariser 200 arranged to predistort the input signal to an RF power amplifier 210. The RF input signal intended for amplifier 210 is sampled by a directional coupler 212 to provide a signal from which the lineariser 200 can generate a predistortion signal for amplifier 210. The coupled port of directional coupler 212 feeds a splitter 214. One output of the splitter is used to down convert the frequency of the output of amplifier 210 for use in a controlled process, as will be described later. The other output of splitter 214 is supplied to a square law detector 216 which provides a baseband version of the sampled RF input. The square law detector 216 may be implemented by means of a mixer or multiplier with both of its inputs receiving the sampled RF input signal so as to multiply the input signal with itself. Alternatively, the square law detector may be implemented by means of a diode detector with an appropriate characteristic.

The output of the square law detector 216 is supplied to a digital signal processor (DSP) 218. The signal from square law detector 216 is converted to a digital signal by analogue to digital converter (ADC) 220. The digital signal from ADC 220 is provided to splitter 222. The splitter 222 provides the digital version of the output of square law detector 216 on three paths. The digital square law detector output is provided on path 224 as a second order distortion component. The digitised square law detector output is also supplied to squaring process 226 which provides a fourth order version of the input signal sampled from coupler 212. This fourth order signal is provided on path 228 as a fourth order distortion component. The fourth order signal is also supplied to mixer 230 where it is mixed with the digitised square law detector output from splitter 222. The output of mixer 230 is supplied on path 232 as a sixth order distortion component. In high performance applications, it may be necessary to remove the unwanted second order component appearing in the sixth order distortion component signal. The second order distortion component can be simply subtracted directly from the sixth order distortion component since the second order distortion component has already been generated (by square order detector 216). The level of second order components in the sixth order signal is mathematically determined and hence perfect subtraction may be achieved without using an additional control scheme which could complicate the lineariser.

The fourth and sixth order distortion components are created by multiplying the digitised square law detector output with itself as required. It will be clear to the skilled person that this multiplicative process could be extended to the generation of eighth order distortion components and higher.

The second order distortion component on path 224 is adjusted in amplitude by variable gain element 234 under the control of controller 236. Similarly, amplitude adjustments are made to the fourth and sixth order distortion components on paths 228 and 232 respectively. The amplitude adjusted distortion components from paths 224, 228 and 232 are summed at combiner 238 to produce a predistortion signal. The controller 236 adds a DC signal into the predistortion signal at combiner 240. The predistortion signal is then output from the DSP 218 via digital to analogue converter (DAC) 242 as an analogue predistortion signal.

In the main signal path, the RF power amplifier 210 is proceeded by a vector modulator 244. The predistortion signal from DSP 218 is supplied to the Q channel mixer 246 of vector modulator 244. The DC signal introduced to the predistortion signal by controller 236 at combiner 240 allows mixer 246 to leak an appropriate amount of the RF input signal energy through the Q channel mixer. Similarly, the I channel mixer 248 is supplied with a DC signal from controller 236 to leak an appropriate amount of the inphase component of the RF input signal energy through that mixer. The mixers 246 and 248 operating on the quadrature-split channels of the input signal allow the input signal vector to be steered through a full 360° and a range of amplitude levels. It is therefore possible to arrange the main input signal vector appropriately to match the predistortion signal vector which is only fed to the Q channel mixer as shown (alternatively, the predistortion signal could be supplied to the I channel mixer or to both the I and Q channel mixers).

The output signal of amplifier 210 is sampled by directional coupler 250 to provide a feedback signal for use by controller 236. The sampled output from coupler 250 and the sampled input signal from splitter 214 are mixed together in mixer 252 in order to frequency down convert the output signal sampled at coupler 250. This mixing process also has the effect of raising by 1 the order of each intermodulation distortion component present in the output of amplifier 210. The output of mixer 252 is supplied to controller 236 via ADC 254. The output signal sampled at directional coupler 250 will contain residual intermodulation distortion (IMD) products created by amplifier 210. In the output of mixer 252, each IMD product will be represented as a corresponding baseband signal at the next highest even order distortion frequency (e.g. a third order IMD product will produce a fourth order baseband signal in the mixer output after down conversion). These baseband even order IMD products may then be detected by the control scheme operated by controller 236 and used to adjust the relative amplitude levels of the distortion components on paths 224, 228 and 232 which make up the predistortion signal. The detailed implementation of the control scheme operated by controller 236 will be discussed in more detail later.

Figure 3:
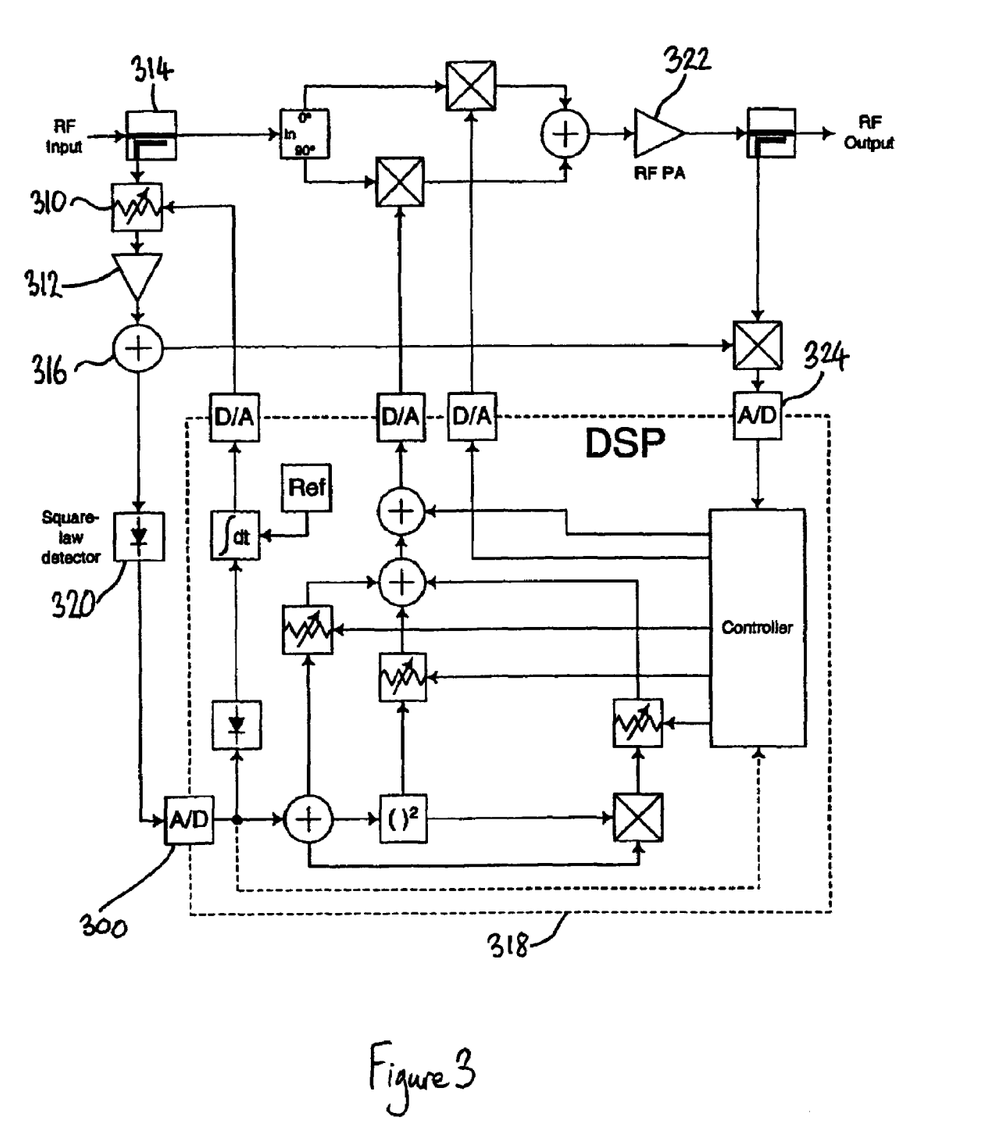
FIG. 3 is a schematic diagram of a further lineariser circuit.

FIG. 3 illustrates a version of the lineariser of FIG. 2 which has been modified to allow a low resolution analogue to digital converter 300 to be used to digitise the square law detector output. This is achieved by incorporating an automatic gain control loop in the lineariser to ensure that the input to ADC 300 remains broadly constant irrespective of the input signal level. A variable gain element 310 and an amplifier 312 operate in succession on the sampled input signal between coupler 314 and splitter 316. The DSP 318 monitors the amplitude of the output of square law detector 320 and produces a signal which controls the variable gain of variable gain element 310 such that the input to ADC 300 maintains a substantially constant amplitude. The DSP 318 can also measure the power level of the signals received at ADC 300 and determine whether or not the lineariser needs to be active, i.e. if the power level of the input signals to the amplifier 322 undergoing linearisation is sufficiently low so that the amplifier 322 is operating within acceptable levels of distortion, then the lineariser can be deactivated.

The DC zone energy in the signal received at ADC 324 can be monitored to set the power output and/or gain of the amplifier 322 undergoing linearisation. This is achieved by adjusting, in equal proportion, the DC levels injected into the mixers of the vector modulator preceding amplifier 322.

In other respects, the lineariser of FIG. 3 is similar in operation to the lineariser of FIG. 2.

In the linearisers of FIGS. 2 and 3, a DC signal is added to the predistortion signal in the digital domain. Due to the dynamic range of this combined signal, a relatively high resolution and high speed DAC (242 in FIG. 2) may be needed to perform the conversion to the analogue domain. The lineariser shown in FIG. 4 is modified to ameliorate this potential disadvantage.

Figure 4:
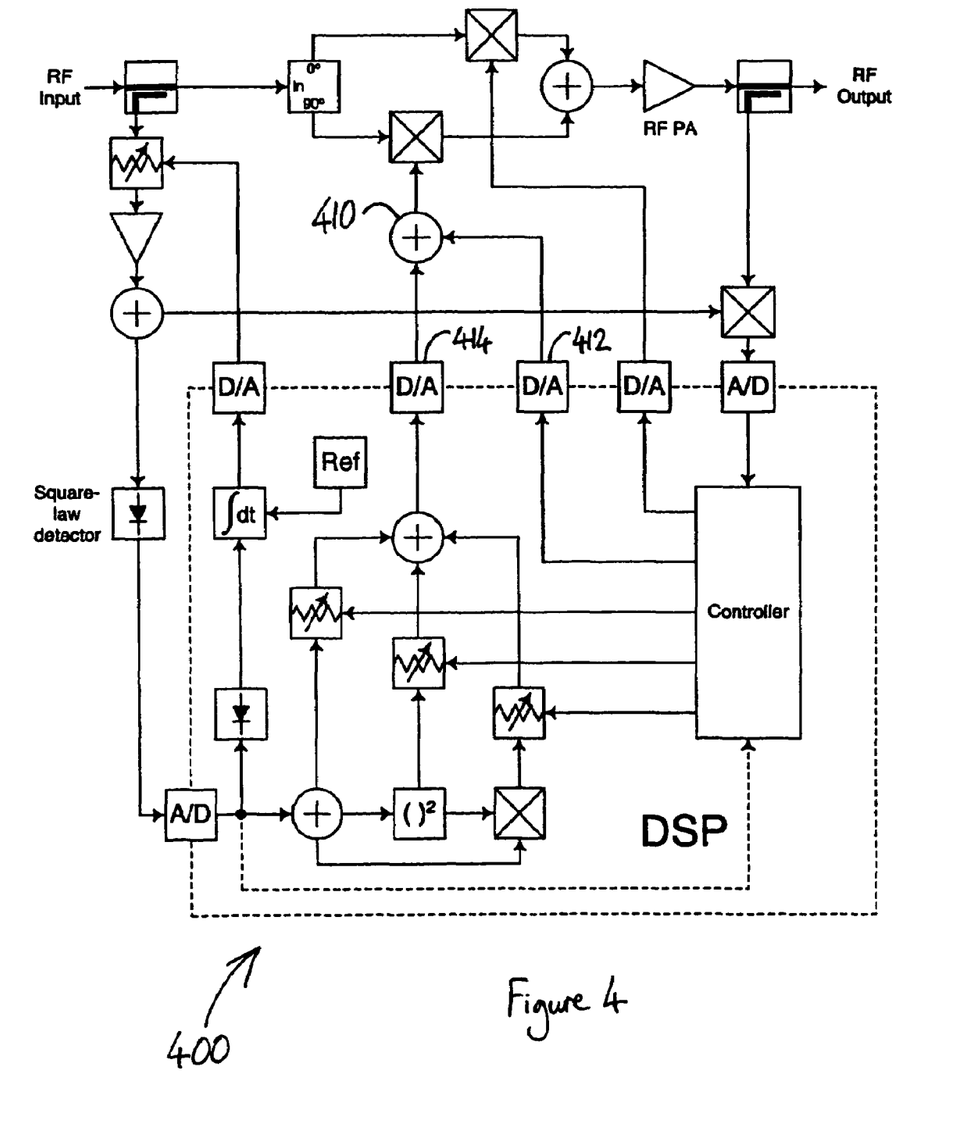
FIG. 4 is a schematic diagram of a yet further lineariser circuit.

The lineariser 400 of FIG. 4 operates in a similar manner to the lineariser of FIG. 3. The lineariser 400 differs in that the addition of a DC signal to the predistortion signal occurs in the analogue domain at combiner 410. This permits the use of a relatively low resolution and low speed DAC 412 to convert the DC signal and a relatively low resolution and high speed DAC 414 for the distortion signal.

Figure 5:
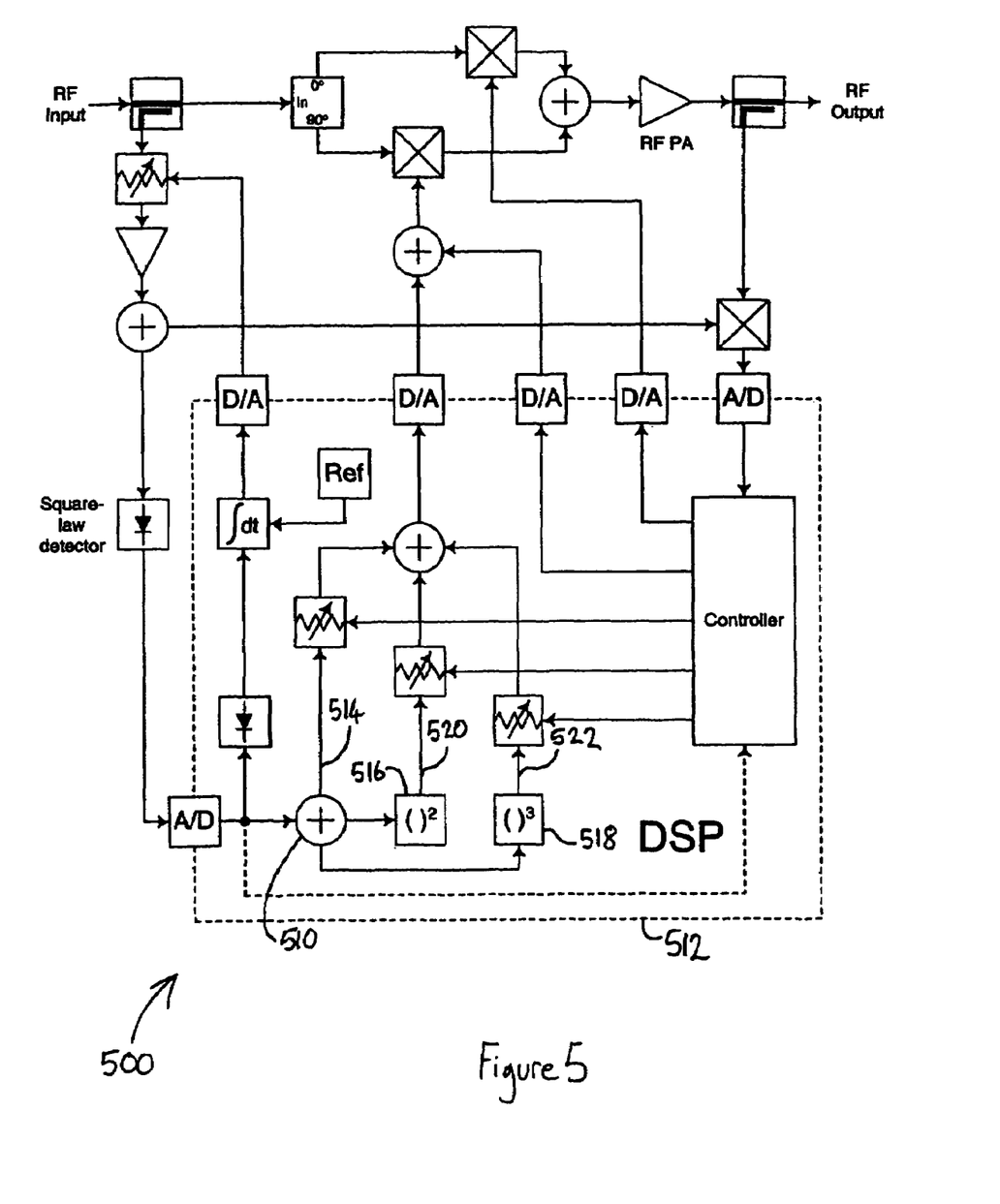
FIG. 5 is a schematic diagram of another lineariser circuit.

The lineariser 500 shown in FIG. 5 is similar to that shown in FIG. 4 except in that a multiplicative process is not used to generate the distortion components. As with the linearisers shown in FIGS. 2,3 and 4, the square law detector output signal is digitised and provided to splitter 510 within DSP 512. As previously, the splitter supplies a signal along a path 514 to provide the second order distortion component. The splitter 510 also provides an output to each of lookup tables 516 and 518. Lookup table (LUT) 516 contains values for the fourth order distortion component which correspond to particular values of the square law detector output signal supplied by splitter 510. The LUT 516 is addressed by the current value of the signal from splitter 510 and retrieves the corresponding value for the fourth order signal, which is output on path 520 as the fourth order distortion signal.

If the LUT 516 does not contain a value for the fourth order distortion component corresponding to the current value of the signal from splitter 510, then an appropriate value for the fourth order distortion component can be interpolated. For example, the fourth order distortion component values stored in LUT 516 which correspond to the values of the square law detector output signal nearest to the true current value of the square law detector output signal can be used to determine a weighted average value for the fourth order distortion component value which should correspond to the current square law detector output signal value.

In a similar manner, the square law detector output signal is used to address LUT 518 which in response outputs corresponding values of the sixth order distortion component on path 522. Further LUT's could be provided and addressed by the square law detector output signal in order to produce additional distortion components. The distortion components are adjusted in amplitude and summed as described previously with reference to FIGS. 2,3 and 4.

Figure 6:
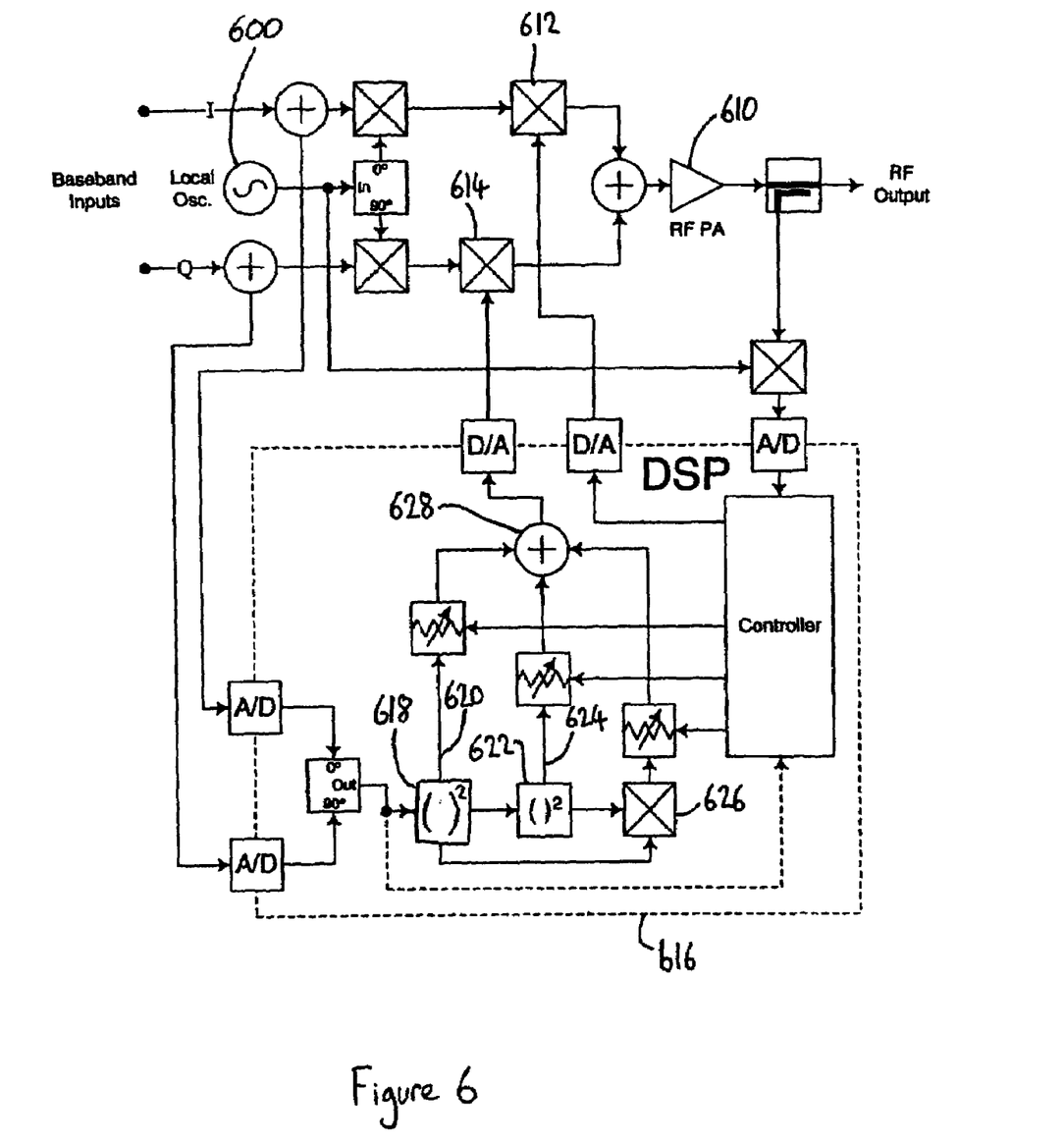
FIG. 6 is a schematic diagram of yet another lineariser circuit.

In FIG. 6, a baseband frequency, quadrature format input signal is provided and is quadrature upconverted using local oscillator 600 to produce a radio frequency input signal for non-linear power amplifier 610. A vector modulator arrangement is incorporated within the upconversion arrangement and comprises mixers 612 and 614 in the I and Q branches respectively of the upconversion process. As with the linearisers previously described, the predistortion signal is applied to mixer 614 and a DC signal is applied to mixer 612. However, in this embodiment, the baseband quadrature format input signal is applied directly to the DSP 616 in order to generate the predistortion signal. Subsequent to analogue to digital conversion, the baseband quadrature format input signals are combined and then squared at 618 to produce a second order distortion component on path 620 the squared output of process 618 is then squared again in process 622 to produce a fourth order distortion component on path 624. The fourth order signal produced by squaring process 622 and the squared signal produced by squaring process 618 are multiplied together in mixer 626 to produce a sixth order distortion component. It will be appreciated that the multiplicative arrangement can be extended to the generation of eighth order and higher distortion components. The distortion components are then adjusted in amplitude and combined at 628 to produce the predistortion signal which is applied to mixer 614. It will be apparent that, in other respects, the lineariser of FIG. 6 is similar in its operation to the foregoing embodiments.

Various control schemes for the amplitude adjustment of the distortion components will now be discussed.

Figure 7:
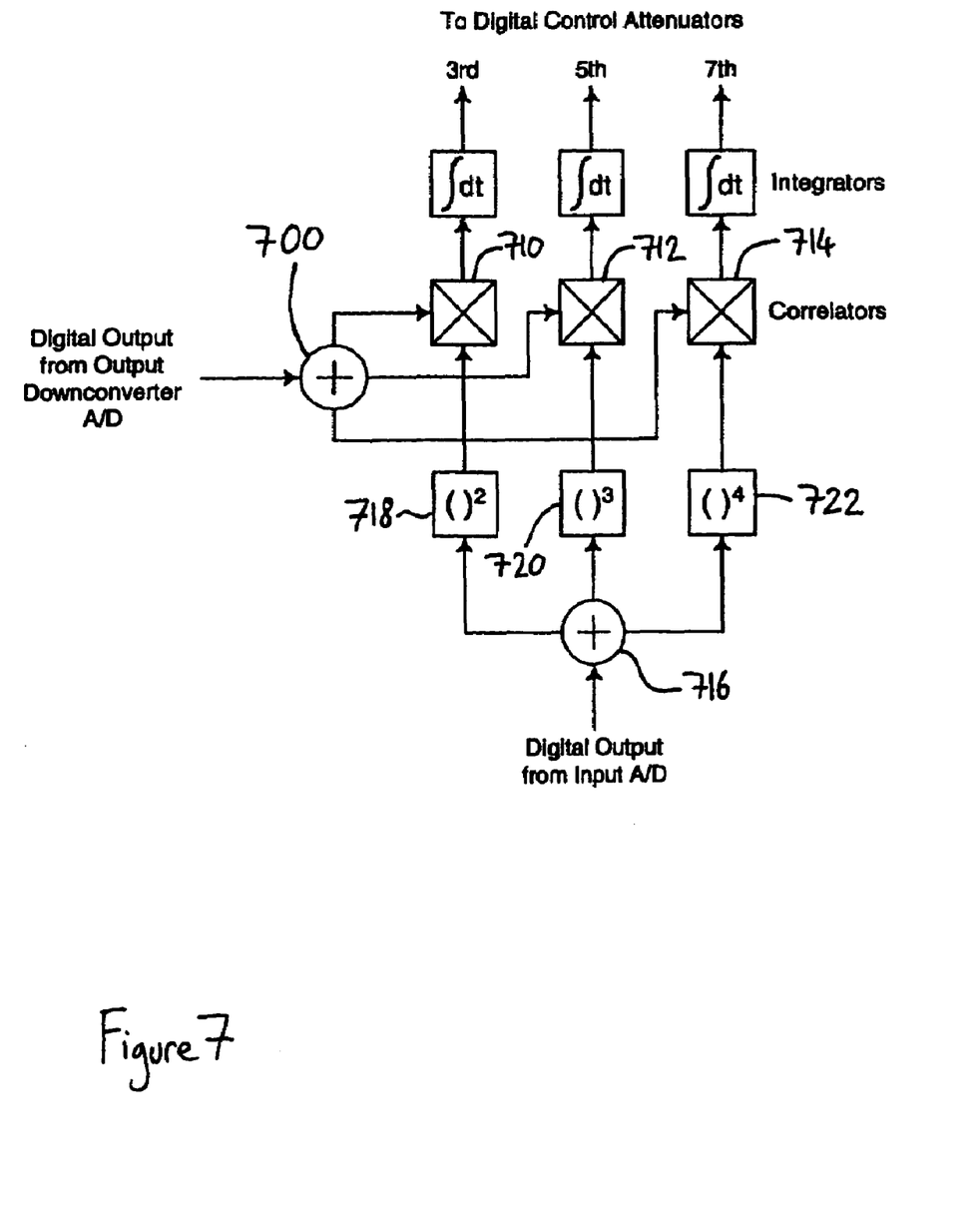
FIG. 7 is a schematic diagram of a control scheme for a lineariser.

FIG. 7 shows a control scheme which may be used with, for example, the linearisers of FIGS. 2 to 5. Splitter 700 receives the digitised result of mixing the sampled input to the non-linear amplifier with its sampled output. This signal can be considered as the output of the amplifier down converted by its input. The signal supplied to splitter 700 thus contains fourth, sixth and eighth order components which correspond to the third, fifth and seventh order intermodulation distortion components created by the non-linear power amplifier undergoing linearisation. Splitter 700 supplies this signal to mixers 710,712 and 714. Splitter 716 receives the digitised square law detector output signal (which is a second order signal) and provides it to processes 718,720 and 722. Process 718 forms the square of its input and thus produces a fourth order output. Process 720 forms the cube of its input and thus produces a sixth order output. Process 722 forms the fourth order version of its input signal and thus produces an eighth order output signal. The outputs of processes 718,720 and 722 are each provided to the input of a respective one of mixers 710,712 and 714. Mixer 710 correlates the fourth order signal from process 718 with any residual fourth order intermodulation distortion present in the signal from splitter 700. The output of mixer 710 is supplied to an integrator which produces a control signal for the variable gain element in the second order distortion component path (i.e. in FIG. 2, this would be variable gain element 234). It will be appreciated that, in effect, mixer 710 correlates the third order IMD distortion produced by the amplifier undergoing linearisation. Although the output of mixer 710 is used to control the gain of the second order distortion component, it will be apparent that this second order distortion component gives rise to a third order distortion component when mixed into the input signal in the vector modulator. Similarly, the sixth order signal from process 770 is correlated with the sixth order IMD distortion in the signal from splitter 700 to produce a control signal for the variable gain element in the fourth order distortion component path. Likewise, the eighth order output of process 722 is correlated with the eighth order IMD distortion appearing in the signal from splitter 700 in order to produce a control signal for the variable gain element in the sixth order distortion component path within the lineariser. The results of the correlations performed by mixers 710,712 and 714 produce control signals that act individually to minimise the third, fifth and seventh order intermodulation distortion in the output of the power amplifier.

Figure 8:
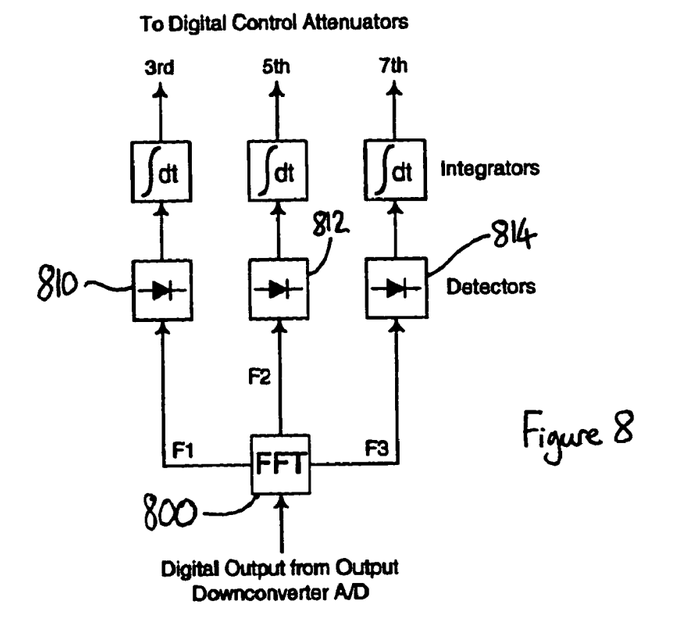
FIG. 8 is a schematic diagram of another control scheme for a lineariser.

FIG. 8 illustrates an alternative control mechanism wherein the result of mixing the non-linear amplifier output and input signals is subjected to fast Fourier transformation using process 800. The signal is thus transformed to the frequency domain and detectors 810,812 and 814 are each used to monitor the power present in a respective portion F1,F2 and F3 of the frequency spectrum. The control mechanism functions by detecting the amount of energy present at given frequency ranges and by minimising this energy on the assumption that it is dominated by the relevant order of intermodulation distortion.

Figure 9:
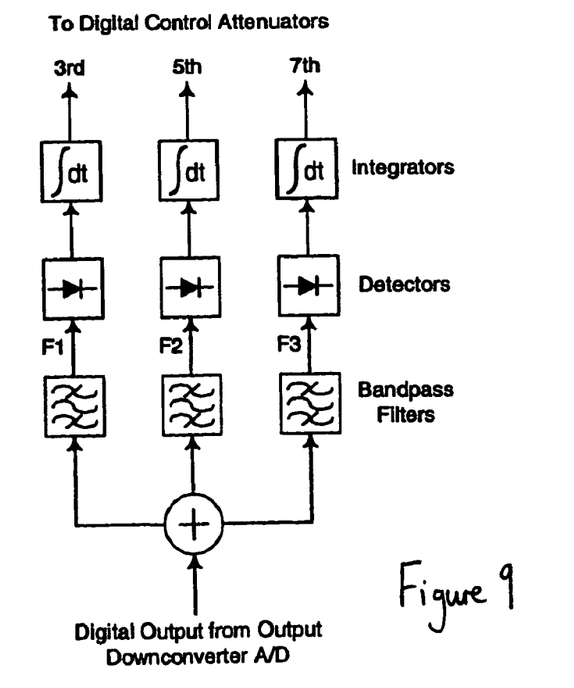
FIG. 9 is a schematic diagram of a further control scheme for a lineariser.

A similar technique is illustrated in FIG. 9, where the frequency separation is performed by using conventional bandpass filtering.

Figure 10:
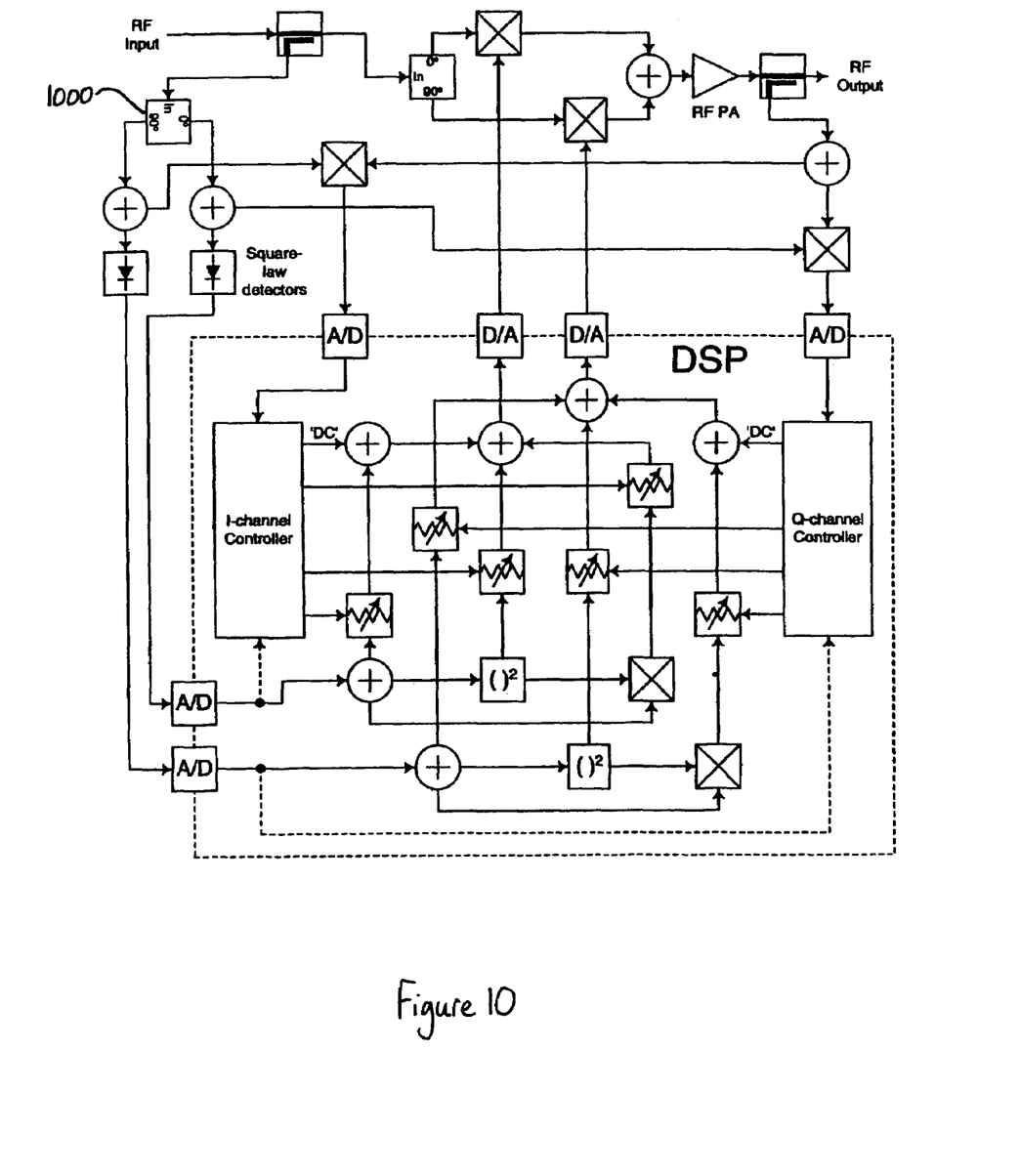
FIG. 10 is a schematic diagram of yet another lineariser circuit.

FIG. 10 illustrates a vector lineariser which is in some respects similar to that described with reference to FIG. 1. The lineariser of FIG. 10 differs from that of FIG. 1 in that the quadrature channels used separately to derive the inphase and quadrature predistortion components applied to the respective mixers of the vector modulator are created in the analogue domain using quadrature splitter 1000. Vector linearisers provide the advantage of being able to set the relative phase and amplitude of each of the distortion components in the predistortion signal independently allowing the lineariser to more accurately cancel the intermodulation distortion produced by the non-linear power amplifier.

Figure 11:
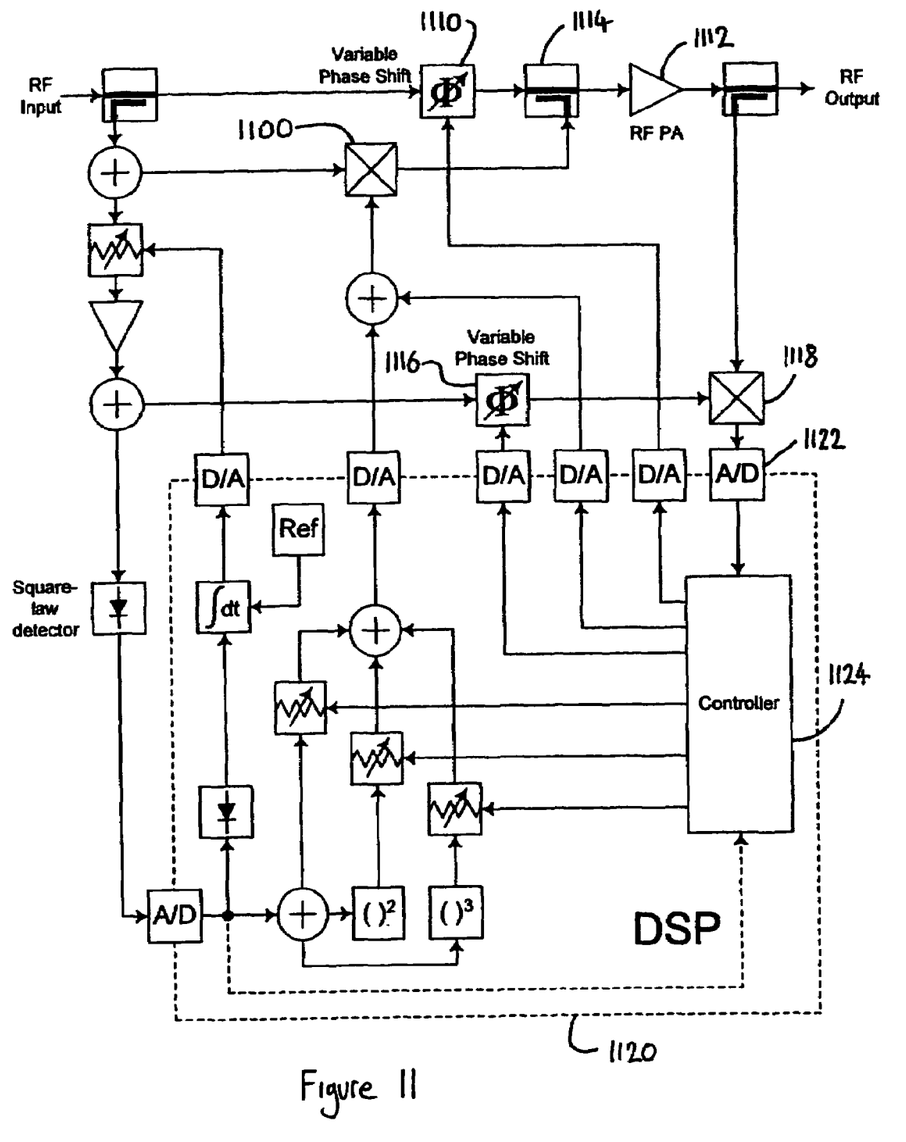
FIG. 11 is a schematic diagram of yet another lineariser circuit.

A modification to the basic system described with reference to previous figures is shown in FIG. 11. Here, the vector modulator has been replaced with an amplitude modulator, shown here as a mixer 1100, and a phase shifter 1110. The operation of the circuit is similar to that described previously, but in this case only two quadrants are available for control (on the assumption that the phase shifter has a range of 90°, which is typical for a single stage RF phase shifter). The two quadrants are obtained by supplying the predistortion signal to mixer 1100 in an inverted or non-inverted form.

As a further modification, the main signal path, prior to the amplifier 1112 undergoing linearisation, now employs a directional coupler 1114 configured with its minimum path loss in the main signal path. The low path loss of directional coupler 1114 and the low loss through the phase shifter 1110 helps to ensure that the overall system noise figure is kept to a minimum. The alternative approach of providing a vector modulator as described previously within the amplifier undergoing linearisation (i.e. after one or more low noise stages) is sometimes not possible due to the limited signal handling capability of such devices when good linearity performance is required.

The lineariser of FIG. 11 also employs a second variable phase shifter 1116 in the input reference path which provides an input signal to output signal downconverting mixer 1118. Phase shift element 1116 is provided to ensure that the detected output signal level from mixer 1118 is maximised, irrespective of the phase shift through amplifier 1112. Phase shifter 1116 is varied by the DSP 1120 until a maximum signal level is detected (resulting in the two signals supplied to mixer 1118 being in phase). This setting can then be stored and the intermodulation distortion reduction control process initiated, with the maximum possible signal to noise ratio being available for the detection process. Without phase shift element 1116, it is possible that the two signal supplied to mixer 1118 could be in quadrature phase and hence the downconversion ADC 1122 would receive a null input signal. The controller 1124 might then assume that either the intermodulation distortion has been cancelled, and/or that the gain of the circuit is too low. In both of these case, the controller 1124 would then take either no action (when action is in fact required) or inappropriate action.

Figure 12:
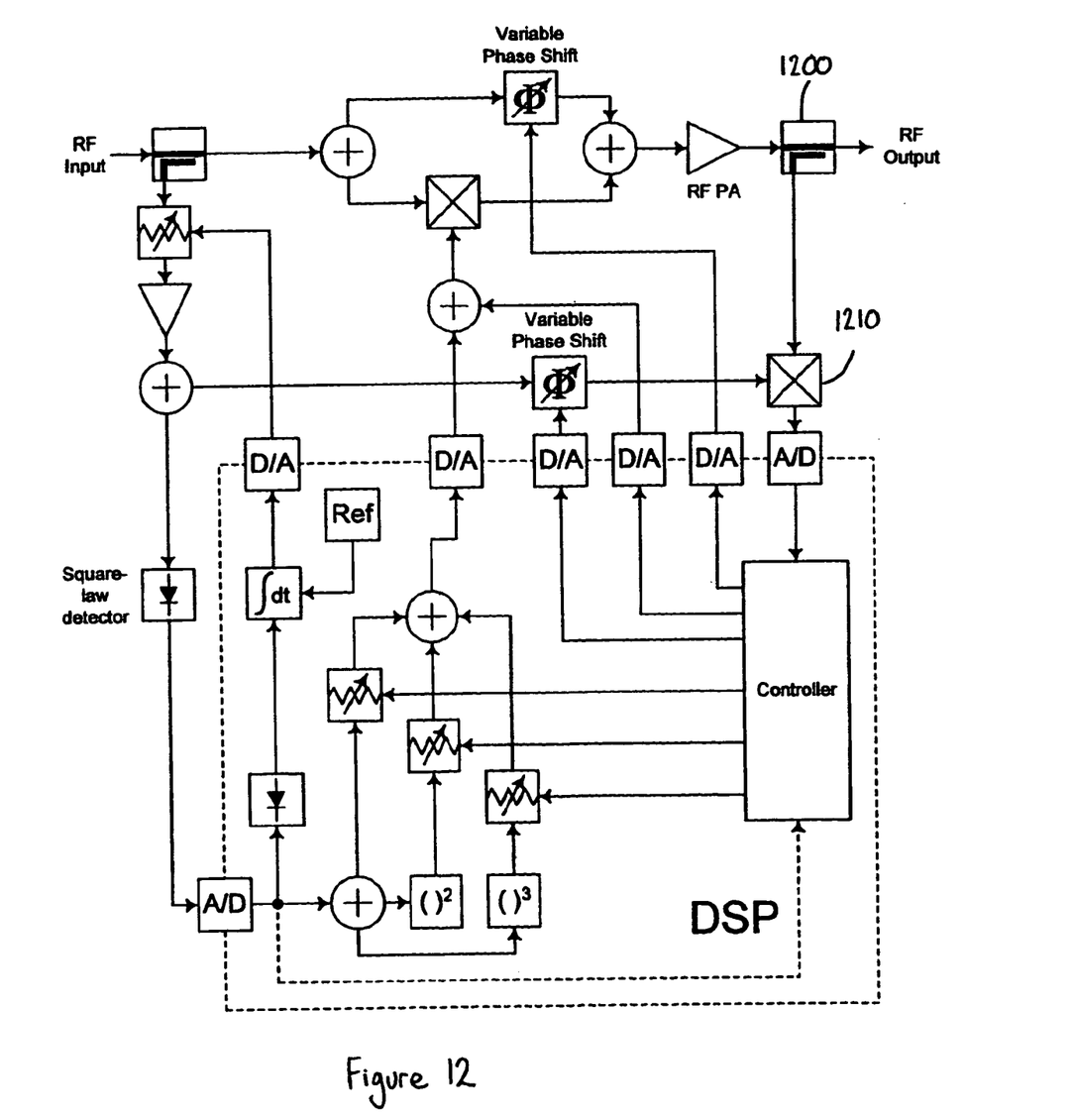
FIG. 12 is a schematic diagram of yet another lineariser circuit.

Clearly, there is a wide range of alternatives to the phase shift elements and amplitude modulation devices introduced in FIG. 11. For example, time delay elements could be used in place of the phase shift elements 1110 and 1116 in FIG. 11. A further alternative configuration of the various couplers and splitters in the main signal path is shown in FIG. 12. Furthermore, the variable phase shift element used in FIGS. 11 and 12 in the input reference path to the downconverting mixer could equally well be inserted in the output sampling path instead, i.e. the phase shifting element could be located between output coupler 1200 and mixer 1210.

It will be apparent that the distortion generating process performed by the DSP in any of the previously described linearisers can be adapted to produce additional, higher order distortion components of the predistortion signal (e.g. eighth order or higher).

The invention claimed is:

1. Apparatus for generating a predistorted signal from an input signal to reduce distortion in an output signal generated by signal handling equipment based on the predistorted signal, the apparatus comprising:
    an extractor adapted to generate an extracted signal from the input signal;
    a generator adapted to generate a distortion signal based on the extracted signal, wherein the distortion signal comprises:
        a second-order distortion component based on a second-order signal generated from the extracted signal; and
        a fourth-order distortion component based on a fourth-order signal generated from the extracted signal; and
    a modulator adapted to modulate the input signal based on the distortion signal to generate the predistorted signal.

2. The invention of claim 1, wherein the distortion signal further comprises a sixth-order distortion component based on a sixth-order signal generated from the extracted signal.

3. The invention of claim 1, wherein the distortion signal does not comprise any odd-order distortion components based on any odd-order signal generated from the extracted signal.

4. The invention of claim 1, wherein the generator is a digital generator adapted to digitally generate the distortion signal.

5. The invention of claim 1, wherein:
    the distortion signal comprises an in-phase component and a quadrature component;
    the in-phase signal comprises:
        a first in-phase component based on the second-order signal; and
        a second in-phase component based on the fourth-order signal; and
    the quadrature signal comprises:
        a first quadrature component based on the second-order signal; and
        a second quadrature component based on the fourth-order signal.

6. The invention of claim 5, wherein:
    the in-phase signal further comprises a third in-phase component based on a sixth-order signal generated from the extracted signal; and
    the quadrature signal further comprises a third quadrature component based on a sixth-order signal generated from the extracted signal.

7. The invention of claim 1, wherein the modulator is adapted to:
    divide the input signal into an in-phase component and a quadrature component;
    multiply one of the in-phase and quadrature components by the distortion signal to generate a first product;
    multiply the other component by only a first DC distortion component to generate a second product; and
    combine the first and second products to generate the predistorted signal.

8. The invention of claim 7, wherein the distortion signal further comprises a second DC distortion component.

9. The invention of claim 1, further comprising automatic gain control (AGC) circuitry adapted to condition the extracted signal such that an envelope of the conditioned signal maintains a substantially constant amplitude.

10. The invention of claim 1, further comprising a controller adapted to control operations of the generator.

11. The invention of claim 10, further comprising one or more mixers, each mixer adapted to multiply a portion of the extracted signal by a portion of the output signal to generate an input signal to the controller.

12. The invention of claim 11, wherein the one or more mixers comprise:
a first mixer adapted to multiply an in-phase portion of the extracted signal by a first portion of the output signal to generate an in-phase input signal to the controller; and
a second mixer adapted to multiply a quadrature portion of the extracted signal by a second portion of the output signal to generate a quadrature input signal to the controller.

13. The invention of claim 10, wherein the controller comprises two or more control paths, each control path adapted to generate a different-order control signal used by the generator to generate a different-order distortion component in the distortion signal.

14. The invention of claim 13, wherein each control path comprises:
a mixer adapted to multiply a portion of the output signal by a different-order signal generated from the extracted signal to generate a product; and
an integrator adapted to integrate the product to generate a corresponding control signal.

15. The invention of claim 13, wherein:
the controller comprises a transformer adapted to generate different-frequency components of the output signal; and
each control path comprises:
a detector adapted to detect a power level of a different-frequency output component; and
an integrator adapted to integrate the detected power level to generate a corresponding control signal.

16. The invention of claim 13, wherein each control path comprises:
a band-pass filter adapted to isolate a different-frequency component of the output signal;
a detector adapted to detect a power level of the different-frequency output component; and
an integrator adapted to integrate the detected power level to generate a corresponding control signal.

17. The invention of claim 1, wherein the input signal is an analog RF signal.

18. The invention of claim 1, wherein the input signal comprises baseband in-phase and quadrature components.

19. The invention of claim 1, wherein:
the modulator comprises a phase shifter, an amplitude modulator, and a coupler;
the amplitude modulator is adapted to modulate the amplitude of the input signal based on the distortion signal; and
the coupler is adapted to combine the outputs from the phase shifter and the amplitude modulator to generate the predistorted signal.

20. The invention of claim 19, wherein:
the phase shifter is adapted to shift the phase of a first portion of the input signal; and
the amplitude modulator is adapted to modulate the amplitude of a second portion of the input signal, different from the first portion.

21. The invention of claim 19, further comprising a second phase shifter adapted to shift phase of one of a portion of the extracted signal and a portion of the output signal, wherein the portions are combined to generate a signal used to control operations of the generator.

22. The invention of claim 1, wherein the signal handling equipment comprises an amplifier.

23. The invention of claim 1, wherein the generator is adapted to generate at least one of the distortion components using a polynomial-based technique or a look-up table-based technique.

24. The invention of claim 1, wherein:
the generator is adapted to generate first and second distortion signals based on the extracted signal; and
the modulator is adapted to:
divide the input signal into an in-phase component and a quadrature component;
multiply the in-phase component by the first distortion signal to generate a first product;
multiply the quadrature component by the second distortion signal to generate a second product; and
combine the first and second products to generate the predistorted signal.

25. A method for generating a predistorted signal from an input signal to reduce distortion in an output signal generated by signal handling equipment based on the predistorted signal, the method comprising:
generating an extracted signal from the input signal;
generating a distortion signal based on the extracted signal, wherein the distortion signal comprises:
a second-order distortion component based on a second-order signal generated from the extracted signal; and
a fourth-order distortion component based on a fourth-order signal generated from the extracted signal; and
modulating the input signal based on the distortion signal to generate the predistorted signal.

26. The invention of claim 25, wherein the distortion signal further comprises a sixth-order distortion component based on a sixth-order signal generated from the extracted signal.

27. The invention of claim 25, wherein the distortion signal does not comprise any odd-order distortion components based on any odd-order signal generated from the extracted signal.

28. The invention of claim 25, wherein the distortion signal is generated digitally.

29. The invention of claim 25, wherein:
the distortion signal comprises an in-phase component and a quadrature component;
the in-phase signal comprises:
a first in-phase component based on the second-order signal; and
a second in-phase component based on the fourth-order signal; and
the quadrature signal comprises:
a first quadrature component based on the second-order signal; and
a second quadrature component based on the fourth-order signal.

30. The invention of claim 29, wherein:
the in-phase signal further comprises a third in-phase component based on a sixth-order signal generated from the extracted signal; and
the quadrature signal further comprises a third quadrature component based on a sixth-order signal generated from the extracted signal.

31. The invention of claim 25, wherein the modulating comprises:
dividing the input signal into an in-phase component and a quadrature component;
multiplying one of the in-phase and quadrature components by the distortion signal to generate a first product;
multiplying the other component by only a first DC distortion component to generate a second product; and
combining the first and second products to generate the predistorted signal.

32. The invention of claim 31, wherein the distortion signal further comprises a second DC distortion component.

33. The invention of claim 25, further comprising conditioning the extracted signal such that an envelope of the conditioned signal maintains a substantially constant amplitude.

34. The invention of claim 25, further comprising controlling operations of the generating.

35. The invention of claim 34, further comprising multiplying a portion of the extracted signal by a portion of the output signal to generate an input signal for the controlling.

36. The invention of claim 35, comprising:
multiplying an in-phase portion of the extracted signal by a first portion of the output signal to generate an in-phase input signal for the controlling; and
multiplying a quadrature portion of the extracted signal by a second portion of the output signal to generate a quadrature input signal for the controlling.

37. The invention of claim 34, comprising, for two or more control paths, generating a different-order control signal used for the generating to generate a different-order distortion component in the distortion signal.

38. The invention of claim 37, comprising, for each control path:
multiplying a portion of the output signal by a different-order signal generated from the extracted signal to generate a product; and
integrating the product to generate a corresponding control signal.

39. The invention of claim 37, wherein:
the controlling comprises generating different-frequency components of the output signal; and
comprising, for each control path:
detecting a power level of a different-frequency output component; and
integrating the detected power level to generate a corresponding control signal.

40. The invention of claim 37, comprising, for each control path:
isolating a different-frequency component of the output signal;
detecting a power level of the different-frequency output component; and
integrating the detected power level to generate a corresponding control signal.

41. The invention of claim 25, wherein the input signal is an analog RF signal.

42. The invention of claim 25, wherein the input signal comprises baseband in-phase and quadrature components.

43. The invention of claim 25, wherein the modulating comprises:
shifting the phase of the input signal;
modulating the amplitude of the input signal based on the distortion signal; and
combining the outputs from the phase shifting and the amplitude modulating to generate the predistorted signal.

44. The invention of claim 43, wherein:
the phase shifter is adapted to shift the phase of a first portion of the input signal; and
the amplitude modulator is adapted to modulate the amplitude of a second portion of the input signal, different from the first portion.

45. The invention of claim 43, further comprising shifting the phase of one of a portion of the extracted signal and a portion of the output signal, wherein the portions are combined to generate a signal used to control operations of the generating.

46. The invention of claim 25, wherein the signal handling equipment comprises an amplifier.

47. The invention of claim 25, wherein at least one of the distortion components is generated using a polynomial-based technique or a look-up table-based technique.

48. The invention of claim 25, wherein:
first and second distortion signals are generated based on the extracted signal; and
the input signal is modulated by:
dividing the input signal into an in-phase component and a quadrature component;
multiplying the in-phase component by the first distortion signal to generate a first product;
multiplying the quadrature component by the second distortion signal to generate a second product; and
combining the first and second products to generate the predistorted signal.

49. Apparatus for generating a predistorted signal from an input signal to reduce distortion in an output signal generated by signal handling equipment based on the predistorted signal, the apparatus comprising:
means for generating an extracted signal from the input signal;
means for generating a distortion signal based on the extracted signal, wherein the distortion signal comprises:
a second-order distortion component based on a second-order signal generated from the extracted signal; and
a fourth-order distortion component based on a fourth-order signal generated from the extracted signal; and
means for modulating the input signal based on the distortion signal to generate the predistorted signal.

50. Apparatus for generating a predistorted signal from an input signal to reduce distortion in an output signal generated by signal handling equipment based on the predistorted signal, the apparatus comprising:
an extractor adapted to generate an extracted signal from the input signal;
automatic gain control (AGC) circuitry adapted to condition the extracted signal so that the conditioned signal envelope maintains a substantially constant amplitude;
a generator adapted to generate a distortion signal based on the conditioned signal; and
a modulator adapted to modulate the input signal based on the distortion signal to generate the predistorted signal.

51. A method for generating a predistorted signal from an input signal to reduce distortion in an output signal generated by signal handling equipment based on the predistorted signal, the method comprising:
generating an extracted signal from the input signal;
conditioning the extracted signal so that the conditioned signal envelope maintains a substantially constant amplitude;

generating a distortion signal based on the conditioned signal; and modulating the input signal based on the distortion signal to generate the predistorted signal.

52. Apparatus for generating a predistorted signal from an input signal to reduce distortion in an output signal generated by signal handling equipment based on the predistorted signal, the apparatus comprising:

means for generating an extracted signal from the input signal;

means for conditioning the extracted signal so that the conditioned signal envelope maintains a substantially constant amplitude;

means for generating a distortion signal based on the conditioned signal; and means for modulating the input signal based on the distortion signal to generate the predistorted signal.

* * * * *